United States Patent [19]

Silfvast

[11] 4,281,030
[45] Jul. 28, 1981

[54] IMPLANTATION OF VAPORIZED MATERIAL ON MELTED SUBSTRATES

[75] Inventor: William T. Silfvast, Holmdel, N.J.

[73] Assignee: Bell Telephone Laboratories, Incorporated, Murray Hill, N.J.

[21] Appl. No.: 149,234

[22] Filed: May 12, 1980

[51] Int. Cl.³ .................. C23C 13/00; C23C 13/12
[52] U.S. Cl. ...................... 427/42; 427/53.1; 219/121 EE; 219/121 EF; 219/121 LE; 219/121 LF; 219/121 LM
[58] Field of Search .................. 427/42, 53.1; 219/121 EE, 121 EF, 121 LE, 121 LF, 121 LM; 204/DIG. 11

[56] References Cited

U.S. PATENT DOCUMENTS

| 3,560,252 | 2/1971 | Kennedy | 427/42 |
| 4,108,751 | 8/1978 | King | 204/192 |
| 4,214,015 | 7/1980 | Stephan | 427/42 |

FOREIGN PATENT DOCUMENTS 1595678  6/1970  France .................. 427/42

OTHER PUBLICATIONS

Nichols, "Brit. Comm. and Electronics", vol. 12, pp. 368-369, Jun. 1965.
Hass et al., "Applied Optics", vol. 8, No. 6, pp. 1115-1118, Jun. 1969.
Agarwal et al., "J. Vac. Sci. Tech.", vol. 12, No. 2, pp. 619-623, Mar. 1975.
Greenwald et al., "Solid State Tech.", Apr. 1979, pp. 143-148.
"Laser Focus", May 1979, pp. 34 and 36.
Auston et al., "Appl. Phys. Lett.", vol. 34, No. 11, pp. 777-779, Jun. 1979.
Hanabusa et al., "Appl. Phys. Lett.", vol. 35, No. 8, pp. 626-627, Oct. 1979.
Ota, "J. Appl. Phys.", vol. 51, No. 2, pp. 1102-1110, Feb. 1980.
Takei et al., "J. Appl. Phys.", vol. 51, No. 5, pp. 2903-2908, May 1980.

*Primary Examiner*—John H. Newsome
*Attorney, Agent, or Firm*—Michael B. Einschlag

[57] ABSTRACT

Implantation of a particle flux (200), for example a laser produced particle flux, upon a substrate (5) is enhanced by premelting the substrate surface with a beam of radiation (110) from a pulsed high energy source (2) such as a laser source. The premelting is provided prior to the arrival of the particle flux in order that the particle flux impinge upon an area of the substrate which is melted.

19 Claims, 1 Drawing Figure

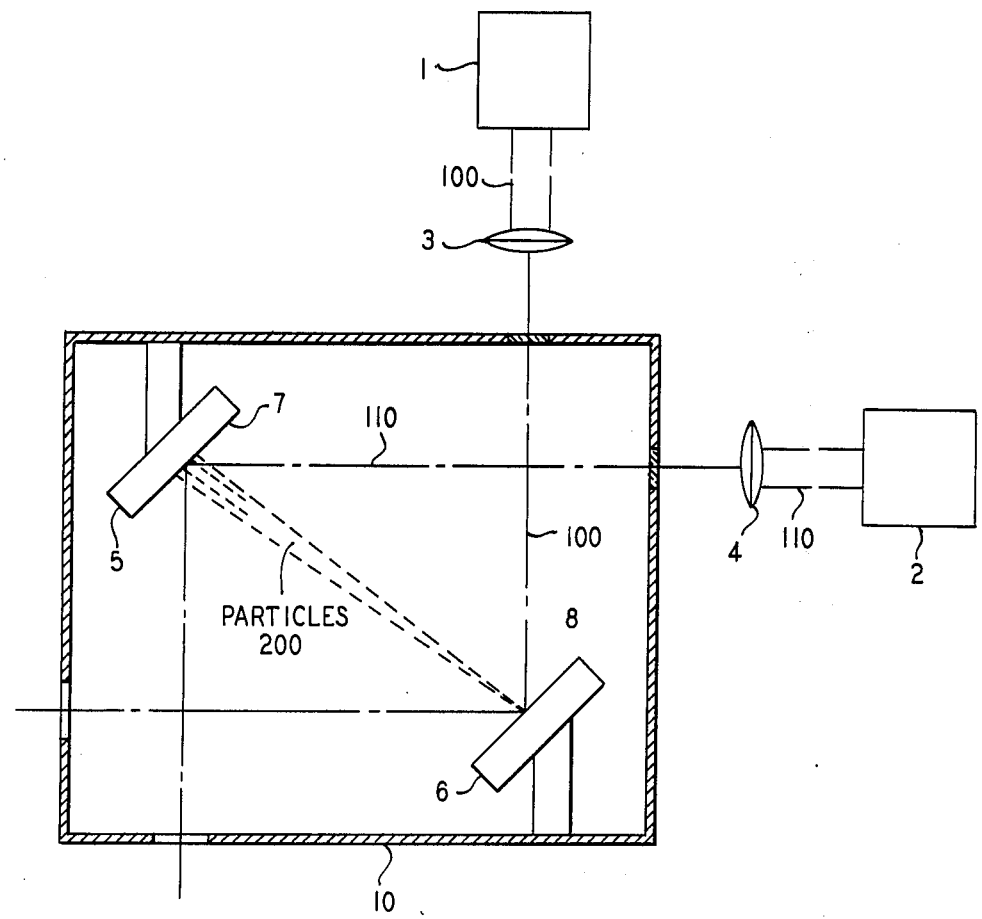

IMPLANTATION OF VAPORIZED MATERIAL ON MELTED SUBSTRATES

BACKGROUND OF THE INVENTION

This invention pertains to the field of material deposition on substrates.

The use of laser beams to evaporate thin films of materials for use in material deposition has been discussed in such references as an article entitled "Vacuum Deposition of Dielectric and Semiconductor Films by a $CO_2$ Laser", *Applied Optics*, Vol. 8, No. 6, June 1969, pp. 1115–1118, by G. Hass and J. B. Ramsey and an article entitled "Lasers and Microelectronics", *British Communications and Electronics*, Vol. 12, June 1965, pp. 368–369, by K. G. Nichols. These references show that laser vaporization is a promising process for producing thin films of materials which are then applied to substrates. However, the thin film coatings do not adhere closely to the substrate upon which they are applied.

SUMMARY OF THE INVENTION

The implantation of a particle flux, for example a laser produced particle flux, upon a substrate is enhanced by premelting the substrate surface with a beam of radiation from a pulsed high energy source such as a laser, electron beam source or a high energy light source. The premelting is provided prior to the arrival of the particle flux in order that the particle flux impinge upon an area of the substrate which is melted. In one embodiment of the present invention the area of the substrate is allowed to solidify prior to the application of further particle flux or further energy pulses.

BRIEF DESCRIPTION OF THE DRAWING

A complete understanding of the present invention may be gained from a consideration of the detailed description presented hereinbelow in connection with the accompanying diagram in which:

The FIGURE shows, in pictorial form, an embodiment of the present invention utilizing a first and a second laser source.

DETAILED DESCRIPTION

The implantation of a particle flux, for example a laser produced particle flux, upon a substrate is enhanced by premelting the substrate surface with a beam of radiation from a pulsed high energy source such as a laser, an electron beam source or a high energy light source. For example an article entitled, "Pulsed Electron-Beam Processing of Semiconductor Devices", (*Solid State Technology*, April 1979, pp. 143–148 by A. C. Greenwald and R. G. Little discloses the use of pulsed electron beams in processing semiconductor devices. The premelting is provided prior to the arrival of the particle flux in order that the particle flux impinge upon an area of the substrate which is melted. In one embodiment of the present invention the area of the substrate is allowed to solidify prior to the application of further particle flux or further energy pulses. It should be clear to those skilled in the art that a process which implements the present invention may use a particle flux obtained by many means. However, for purposes of describing the present invention, I will describe an embodiment in which the particle flux is provided as a laser produced particle flux.

When a laser is focused onto the flat surface of a solid material, the solid material is vaporized if the laser intensity is above $\sim 10^6$ W/cm$^2$. At a laser intensity of $\sim 10^6$ W/cm$^2$ I expect a particle flux from the surface of $10^3$ to $10^4$ ions per pulse whereas at laser intensities of $10^8$ to $10^9$ W/cm$^2$ I expect significant fluxes of $10^{15}$ to $10^{20}$ ions per pulse.

The application of laser radiation produces a stream of ions which flows outward from the target surface at velocities of the order of $10^6$ cm/sec or higher. A film of the material vaporized from the target surface is deposited on a collector substrate surface which is disposed in the path of the ion flux. If a chamber, shown in the FIGURE, containing the two surfaces, i.e., target and collector, has a low ambient pressure, the ions move in straight lines from the target material in the focal region of the laser.

The ion densities that impinge upon the collector substrate surface may be made large enough to produce surface layers of the target material on the order of one atom or more in thickness for each laser pulse which originally impinged upon the target substrate. This technique for growing crystals is conceptually similar to molecular beam epitaxy (MBE) where a molecular or atomic beam of material emerges from an oven. However, with laser vaporization, the particle flux comprises a stream of ions as compared to a molecular or atomic beam for MBE.

An advantage of the laser vaporization process is that, at the rate of one atomic layer per laser pulse, only about 1,000 pulses would be required to produce a 1 $\mu$m thick layer. This rapid growth rate is useful in reducing the concentration of impurities from the residual background pressure of the chamber which plagues the molecular beam epitaxy process. The maximum laser pulse rate is determined by the length of time required for rearrangement of the crystalline collecting substrate surface. This time would be of the order of thermal vibrations of the solid substrate. A further advantage of laser vaporization is that the high velocity of the ions from the laser vaporized target allows penetration into the collecting substrate and allows the ions to access vacancies that could not be reached by the low velocity particles typical of molecular beam epitaxy. This is important for such high vapor pressure materials as zinc. Furthermore, the rapid nature of the laser vaporization process also keeps high vapor pressure materials from evaporating from the collector surface before they are covered by the next layer.

In accordance with an embodiment of a process provided according to the present invention, epitaxial growth of an implanted particle flux on the collector substrate surface is improved by melting a portion of the collector substrate surface with a pulse of laser radiation before the particle flux of material produced by laser vaporization of the target material arrives at the collector substrate.

In the FIGURE, target 6 and collector substrate 5 are placed in vacuum chamber 10. Beam 100 is produced by laser source 1. Focusing system 3 focuses beam 100 onto surface 8 of target 6 to produce particle flux 200. Ions in particle flux 200 travel toward collecting substrate surface 5 at a speed of approximately $10^7$ cm/sec. At the time just before the pulse of ions in particle flux 200 arrive at surface 7 of collector substrate 5, beam 110, a pulse of laser radiation produced by laser source 2 and focused by focusing system 4, arrives at surface 7 of collecting substrate 5. Beam 110 melts surface 7 in the area upon which it impinges. The efficacy of the process provided according to the present invention is that ions in particle flux 200, having energies of 1–5 keV would penetrate the liquid portion of surface 7 quite easily, whereas atoms of the material of target 6 would require much higher energies, of the order of 50–100 keV in order to penetrate a solid.

After the ions have penetrated the liquid, they diffuse to form a uniform distribution and solidify in an epitaxial growth pattern. The diffusion lengths are limited by the recrystallization time. This recrystallization time is adjusted by adjusting the pulse duration of beam 110. Thus, this process provides both rapid ion implantation and simultaneous substrate annealing.

In one embodiment of the present invention, a $CO_2$-TEA laser-produced boron plasma may be used to ion implant n-type silicon wafers. The 5 J output from the $CO_2$-TEA laser is focused with a 3" focal length lens onto a boron target placed in a $10^{-5}$ Torr vacuum. The ion flux produced from a single laser pulse focused on the boron target in a vacuum provides ion energies of 1 keV, which energies correspond to velocities of up to $1.3 \times 10^7$ cm/sec in the boron particle flux. The ion flux densities available at the silicon wafer, the collector substrate, are estimated to be greater than $10^{16}$ particles/$cm^2$-s.

In producing a laser produced particle flux I used a laser with a 10.6 $\mu m$ laser pulse having a 200 ns spike containing one-third of the pulse energy and a 2 $\mu s$ tail containing two-thirds of the pulse energy. The target was positioned so that the target normal made a 45° angle with respect to the incident laser pulse. The resulting plasma flux of target material evolves in a direction normal to the target surface and is confined largely to a solid angle on the order of ~0.15 steradians. Silicon collector substrate samples were positioned parallel to the boron target substrate and centered with respect to the normal projected from the focal region of the laser at a distance of 2.5 cm from the boron target surface. This arrangement allows the silicon collector substrate to receive the maximum boron flux without interfering with the incoming laser beam and also allows the laser beam reflected by the boron target substrate to bypass the collector substrate. At a distance of 2.5 cm, the major portion of the boron plasma flux is concentrated in a ~1 $cm^2$ region on the silicon collector substrate surface.

I measured the boron ion flux velocity by observing the delayed arrival of the ions at various positions in the evacuated cell. The electron and ion densities were high enough to cause significant recombination radiation during the transit time of the plasma. The recombination radiation was observed at various positions along the normal from the boron target substrate to the silicon collector substrate sample. I found the strongest emission in the visible spectrum occurred at 4487 Å, which corresponds to an emission line in the excited spectrum of $B^{2+}$. This suggests that the predominant species in the plasma is $B^{3+}$. The relative time delay between the leading edge of $B^{2+}$ emission at two different distances from the boron target substrate implies an ion velocity of $1.3 \times 10^7$/cms or an ion energy of 1.0 keV. I attempted to accelerate or retard the ions by biasing the silicon collector substrate at voltages of up to ~30 kV with respect to the boron target substrate but I detected no significant change in implantation results. This result is not surprising since a high density neutral plasma would not react to the electric field nor would the positive and negative charges tend to separate by much more than a Debye length in response to the field.

I determined that a 10 Å surface layer of boron was deposited upon the silicon per laser pulse.

An article entitled "Dynamics of Q-switched Laser Annealing", *Applied Physics Letters*, Vol. 34, No. 11, June 1, 1979, by D. H. Auston, J. A. Golovchenko, A. L. Simons and C. M. Surko, pp. 777–779 discloses information which can be used with the above-described laser-produced particle flux in accordance with the step of melting of the target surface. In dealing with samples of Ge (unimplanted), GaAs (implanted) with 50-keV Te at $10^{16}/cm^2$, silicon (unimplanted) and silicon (implanted) with 30-keV arsenic at $10^{15}/cm^2$ exposed to 1.06 $\mu m$ and 0.53 $\mu m$ radiation, the article discloses that the frequency-doubled, 0.53 $\mu m$, radiation is considerably more efficient in initiating the melt process in silicon than the 1.06 $\mu m$ radiation. They also disclose the fact that the ratio of the optical energies absorbed in the implanted silicon samples at 1.06 $\mu m$ and 0.53 $\mu m$ is approximately 1:20, which ratio compares favorably with the ratios of melt thresholds for these samples. The energies required for melting Ge and GaAs at 530 nm are reduced from those of silicon due to the lower melting points.

Finally, the article comments on an application of the data reported therein by noting that the 530-nm light is much more efficient in coupling to the solid than is the 1060-nm light. They further comment as follows:

"This might seem to be a mixed blessing in view of the fact that the process of frequency doubling to the shorter wavelength is done with at most ~30 percent efficiency. In our experiment this value was close to 10 percent. Nevertheless, all of the incident energy can be coupled to the solid with efficiencies, near the 530-nm case if the unconverted component of the incident beam is also allowed to irradiate the sample. This is because once the 530-nm light melts the top layer of silicon the absorption coefficient for the 1060-nm light increases dramatically, resulting in a high efficiency of coupling for this major component of the incident light. Only enough 530-nm light is necessary in applications to trigger the liquid layer. Thus, the full energy from large Nd laser systems is made available for annealing without complications such as doping level dependence of the threshold or ultimate depth distributions known to exist for 1060-nm annealings."

Thus, I find that the requirements for a laser to do the surface pre-melting are somewhat restrictive. The energy required for melting Si substrates is in the range of 1–10 J/$cm^2$. In addition, the wavelength of the laser must be in a region in which the crystal is absorbing (but not highly absorbing). For most materials this involves a laser in the visible or near infrared. In addition, the pulse length of the laser is important. In order to avoid having the laser interfere with the arrival of the high material flux, the pulse length should be less than 100 nsec. On the other hand, if the pulse length is too short, the intensity would have to be so high in order to provide the above-mentioned energy, that vaporization would most likely occur instead of melting. Thus, a pulse length of the order of tens of nanoseconds appears to be the most appropriate length.

The above requirements are satisfied with a Nd:YAG laser operating at either 1.06 $\mu m$ or doubled at 5300 Å for melting Si. Examples of lasers currently available that meet these requirements are a Molectron laser having an energy of 0.7 J, a Molectron laser having an energy of 1.0 J, a Quanta Ray laser having an energy of 0.7 J, a Quanta Ray laser having an energy of 0.85 J, and a Quanta Ray laser having an energy of 1.5 J.

It should be clear to those skilled in the art that further embodiments of the present invention, which embodiments utilize laser produced particle fluxes may be obtained utilizing a single laser for providing both the laser produced particle flux and the radiation used to melt the target substrate. Since it should be clear from the description provided hereinabove that the intensity of radiation necessary to produce a particle flux and the intensity of radiation necessary to melt the collector substrate are different, straightforward mechanisms are used to take into account the intensity differences. Furthermore, as noted hereinabove the collector substrate melting is a function of radiation wavelength so that frequency changing techniques such as frequency doubling may also be appropriate in order to optimize processes provided according to the present invention.

An experiment was designed to test the adhesion of metal contacts onto a glass substrate. A portion of a $CO_2$ laser beam was focused onto a copper target (intensity $10^8$ W/cm$^2$) to produce a high flux of Cu ions. The ions were directed towards a glass substrate, which glass substrate had been pre-melted by a portion of the beam from the same $CO_2$ laser (intensity $\sim 10^6$ W/cm$^2$). In a region of the glass substrate where the pre-melting had occurred, the adhesion of the Cu on the glass was found to be much higher than that in a region where no pre-melting occurred. It was also much higher than that produced as a result of ordinary vacuum deposition of Cu on a similar glass substrate.

I claim:

1. A method of depositing material from a particle flux onto a collector substrate which comprises the steps of:
    disposing said collector substrate in the path of said particle flux;
    characterized in that
    said method further includes the step of directing a pulse of radiation from an energy source to impinge upon and melt an area of the surface of said collector substrate before said particle flux impinges thereon.

2. A method of depositing material in accordance with claim 1 which is further characterized in that said energy source is a laser source.

3. A method of depositing material in accordance with claim 1 which is further characterized in that said energy source is an electron beam source.

4. A method of depositing material in accordance with claim 1 which includes the further step of waiting until said area has solidified before directing further pulses of radiation to impinge thereon.

5. A method of depositing material from a target material onto a collector substrate which comprises the steps of:
    directing a first pulse of radiation from an energy source to impinge upon said target material to produce a particle flux from said target material; and
    disposing said collector substrate in the path of said particle flux
    characterized in that said method further includes the step of directing a second pulse of radiation from said energy source to impinge upon and melt an area of the surface of said collector substrate before said particle flux impinges thereon.

6. A method of depositing material in accordance with claim 5 which is further characterized in that said energy source is a laser source.

7. A method of depositing material in accordance with claim 6 wherein the intensity of said laser source is greater than or equal to $10^8$ W/cm$^2$.

8. A method of depositing material in accordance with claim 5 which includes the further step of waiting until said area has solidified before directing further second pulses of radiation to impinge thereon.

9. A method of depositing material from a target material onto a collector substrate which comprises the steps of;
    directing a first pulse of radiation from a first energy source to impinge upon said target material to produce a particle flux from said target material; and
    disposing said collector substrate in the path of said particle flux
    characterized in that said method further includes the step of directing a second pulse of radiation from a second energy source to impinge upon and melt an area of the surface of said collector substrate before said particle flux impinges thereon.

10. A method of depositing material in accordance with claim 9 which is further characterized in that said first energy source is a first laser source having an intensity greater than or equal to $10^8$ W/cm$^2$ and said second energy source pulse is a second laser source.

11. A method of depositing material in accordance with claim 10 which includes the further step of waiting until said area has solidified before directing further second pulses of radiation to impinge thereon.

12. An apparatus for depositing material from a target (8) onto a collector substrate (5) which comprises:
    an evacuated chamber (10) within which said target and said collector substrate are disposed;
    a first source (1) of first radiation;
    means (3) for applying said first radiation to said target to provide a particle flux of material from said target, which particle flux travels toward said collector substrate;
    a second source (2) of second radiation; and
    means (4) for applying said second radiation to said collector substrate to melt an area of the surface of said collector substrate before said particle flux impinges thereon.

13. An apparatus in accordance with claim 12 wherein said first source is a laser source.

14. An apparatus in accordance with claim 12 wherein said first source is an electron beam source.

15. An apparatus in accordance with claim 13 wherein said second source is a laser source.

16. An apparatus in accordance with claim 13 wherein said second source is an electron beam source.

17. An apparatus in accordance with claim 14 wherein said second source is a laser source.

18. An apparatus in accordance with claim 14 wherein said second source is an electron beam source.

19. An apparatus for depositing material from a target (8) onto a collector substrate (5) which comprises:
    an evacuated chamber (10) within which said target and said collector substrate are disposed;
    a source (1) of radiation;
    means (3) for applying said radiation to said target to provide a particle flux of material from said target, which particle flux travels towards said collector substrate;
    means for applying further radiation from said source to said collector substrate to melt an area of the surface of said collector substrate before said particle flux impinges thereon.

* * * * *